(12) United States Patent
Yang et al.

(10) Patent No.: US 6,693,500 B2
(45) Date of Patent: Feb. 17, 2004

(54) FILM BULK ACOUSTIC RESONATOR WITH IMPROVED LATERAL MODE SUPPRESSION

(75) Inventors: Doo Yeoul Yang, Suwon (KR); Hong Wook Kim, Kyungki-do (JP)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 10/122,241

(22) Filed: Apr. 16, 2002

(65) Prior Publication Data

US 2002/0196103 A1 Dec. 26, 2002

(30) Foreign Application Priority Data

Jun. 25, 2001 (KR) .......................................... 2001-36162

(51) Int. Cl.[7] .................................................. H03H 9/58
(52) U.S. Cl. ........................ 333/189; 310/365; 310/367
(58) Field of Search ................................ 333/186–192; 310/320–324, 349, 351, 353, 365, 366, 334, 335, 311

(56) References Cited

U.S. PATENT DOCUMENTS

| | | | | | |
|---|---|---|---|---|---|
| 5,578,974 | A | * | 11/1996 | Yang et al. ................... | 333/187 |
| 5,903,087 | A | * | 5/1999 | Mattson et al. .............. | 310/365 |
| 6,069,353 | A | * | 5/2000 | Jung et al. ................ | 250/214.1 |
| 6,150,703 | A | | 11/2000 | Cushman et al. ........... | 257/415 |
| 6,215,375 | B1 | | 4/2001 | Larson, III et al. ......... | 333/187 |
| 2003/0006672 | A1 | * | 1/2003 | Sunwoo et al. ............. | 310/322 |

* cited by examiner

*Primary Examiner*—Terry D. Cunningham
*Assistant Examiner*—Quan Tra
(74) *Attorney, Agent, or Firm*—Lowe Hauptman Gilman & Berner LLP

(57) ABSTRACT

A film bulk acoustic resonator includes a substrate, a membrane, a piezoelectric layer and a pair of electrodes. The membrane is formed on the substrate to form an air gap. The piezoelectric layer is formed on the membrane. The electrodes are formed on both surfaces of the piezoelectric layer to partially overlap each other. All the sides of the piezoelectric layer and the electrodes are curved.

4 Claims, 12 Drawing Sheets

FILM BULK ACOUSTIC RESONATOR WITH IMPROVED LATERAL MODE SUPPRESSION

BACKGROUND OF THE INVENTION

1. Field of the Invention

The present invention relates generally to a film bulk acoustic resonator, and more particularly to a film bulk acoustic resonator with improved lateral mode suppression.

2. Description of the Prior Art

Currently, there increases a demand for Radio Frequency (RF) filters that are mounted in portable communication systems having a carrier frequency bandwidth of 900 MHz to 3 GHz. RF filters are generally classified into dielectric filters and Surface Acoustic Wave (SAW) filters. In recent years, a Film Bulk Acoustic Resonator (FBAR) using semiconductor thin film technology has been developed to implement a single chip.

FIGS. 1a and 1b show a general structure of such a FBAR that is manufactured by the thin film technology, in which FIG. 1a is a front sectional view thereof and FIG. 1b is a plan view thereof. The FBAR 10, as shown in FIGS. 1a and 1b, comprises a substrate 11, a piezoelectric layer 12 positioned on the substrate 11 and made of a piezoelectric material such as ZnO or AlN, and metallic electrodes 13 and 14 attached to the upper and lower surfaces of the piezoelectric layer 12. The FBAR functions to pass therethrough only a signal around a resonant frequency adjusted by the thickness of the piezoelectric layer while part of electric energy inputted to the piezoelectric layer 12 through the electrodes 13 and 14 is converted into mechanical energy and this mechanical energy is reconverted into electric energy.

The FBAR utilizes transverse resonant characteristics. Ideally, it is preferable that only transverse modes exist. As shown in FIG. 2, a frequency pass characteristic graph for a filter comprised of FBARs, in which lateral modes are generated, represents characteristics that an abrupt peak is generated in a pass characteristic graph around a pass band, its characteristic curve is not smooth, and prominences and depressions are generated like the generation of noises. Generally, the thickness of the FBAR is about 0.5 to 3.0 μm, and the width of the piezoelectric layer is about 30 to 300 μm. In the FBAR, the ratio of the thickness to the width is about 1/500 to 1/50. The thickness is considerably small compared with the width of the piezoelectric layer. If the ratio of the thickness of the piezoelectric layer to the width is small, the lateral modes in the piezoelectric layer are generally negligible. However, it the ratio of the thickness to the width is increased by decreasing the width to reduce the area of the FBAR, the increase in the ratio affects the transverse vibration characteristics of the piezoelectric layer. In particular, as shown in FIG. 1b, when both opposite sides of an electrode 13 of the FBAR 10 are parallel with each other, lateral modes 15 generated on one of the opposite sides are reflected by the other side and superposed on one another. If the lateral modes are superposed on one another and amplified, a lateral mode having an exceedingly small amplitude affects transverse vibration characteristics.

In order to suppress such lateral modes, U.S. Pat. No. 6,150,703 discloses a FBAR 20 in which the sides of its piezoelectric layer 22 or electrodes 23, as shown in FIG. 3, are comprised of straight lines that are not parallel with one another.

Additionally, U.S. Pat. No. 6,215,375 discloses a FBAR 30 in which the sides of its electrode 33, as shown in FIG. 4, forms an irregular polygon whose any two sides are not parallel with each other. This FBAR is effective in suppressing lateral modes 35 in such a way that the lateral modes 35 are prevented from being superposed on one another.

However, in the conventional FBARs, all the sides of their electrodes are comprised of straight lines, so the interference of neighboring modes is small. In more detail, as shown in FIG. 3, modes generated on one side are reflected by the opposite side and the latter side forms a straight line, so the interference of lateral modes is reduced. Accordingly, lateral modes, which are not destroyed by interference, exist and affect the transverse vibration characteristics of the piezoelectric layer.

SUMMARY OF THE INVENTION

Accordingly, the present invention has been made keeping in mind the above problems occurring in the prior art, and an object of the present invention is to provide a FBAR, which is capable of suppressing lateral modes, thereby having smooth characteristics without irregularities.

Another object of the present invention is to provide a pass band filter in which a plurality of FBARs are connected to one another.

In order to accomplish the above object, the present invention provides a film bulk acoustic resonator, comprising a piezoelectric layer, and electrodes formed on both surfaces of the piezoelectric layer to be partially opposite and overlapped, wherein all sides of at least one of the electrodes and/or all sides of the piezoelectric layer are curved.

In addition, the present invention provides a film bulk acoustic resonator, comprising a substrate; a supporting layer formed on the substrate to form an air gap; at least two piezoelectric layers formed on the supporting layer; and a pair of electrodes formed on both surfaces of the piezoelectric layer to be partially opposite and overlapped; wherein all the sides of at least one of electrode and/or all the sides of at least one of the piezoelectric layers are curved.

In addition, the present invention provides a filter that is constructed by connecting a plurality of FBARs in parallel or series with one another.

BRIEF DESCRIPTION OF THE DRAWINGS

The above and other objects, features and other advantages of the present invention will be more clearly understood from the following detailed description taken in conjunction with the accompanying drawings, in which:

FIGS. 1a and 1b are views of a conventional FBAR, in which FIG. 1a is a front sectional view and FIG. 1b is a plan view;

FIGS. 5a and 5b are view showing a FBAR of the present invention, in which FIG. 5a is a front sectional view and FIG. 5b is a plan view showing part of an upper electrode and a piezoelectric layer;

DESCRIPTION OF THE PREFERRED EMBODIMENTS

In a FBAR in accordance with the present invention, all the sides of a pair of electrodes or a piezoelectric layer are curved so as to suppress the superposition of lateral modes due to the presence of parallel sides and the amplification of neighboring lateral modes.

Figure 5A:
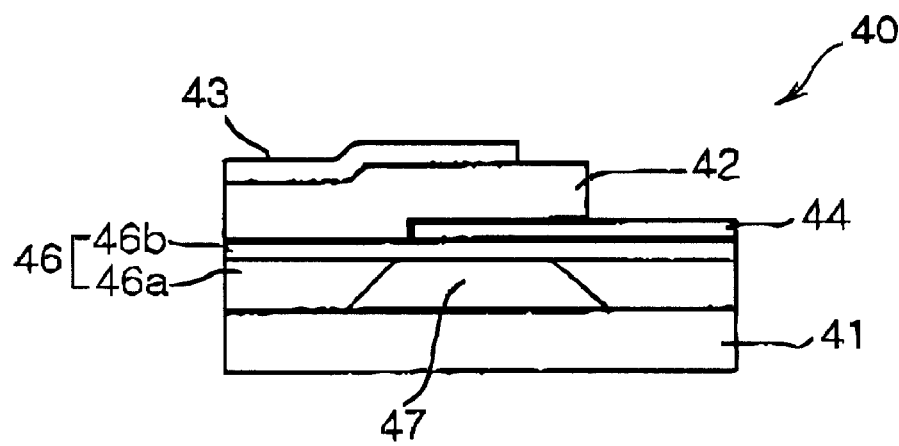
Figure 5B:
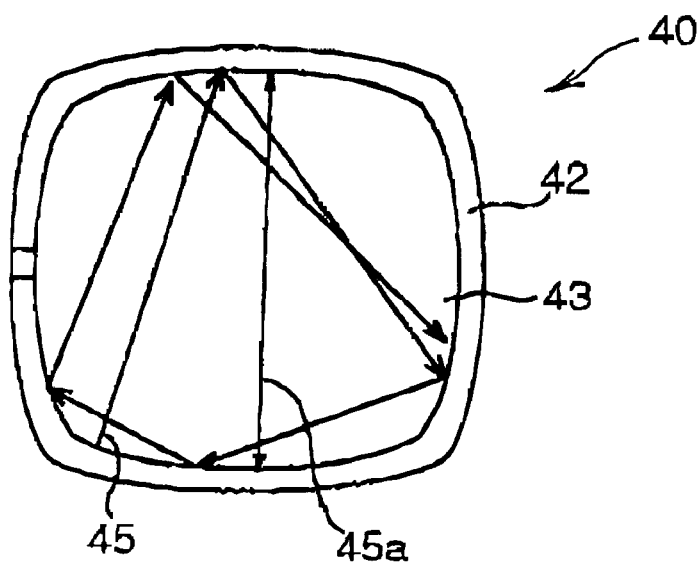

FIGS. 5a and 5b are view showing a FBAR of the preferable embodiment according to the present invention, in which FIG. 5a is a front sectional view and FIG. 5b is a plan view showing part of an upper electrode and a piezoelectric layer.

The FBAR of the embodiment, as shown in FIG. 5a, comprises a substrate 41, a supporting layer 46, a piezoelectric layer 42 and a pair of electrodes 43 and 44. The supporting layer 46 may include a membrane supporting layer 46a and having a cavity as an air gap and a membrane layer 46b formed thereon.

The substrate 41 may be made of Si or GaAs that is used to manufacture a semiconductor substrate.

The membrane supporting layer 46a of the supporting layer 46 is formed on the substrate 41, the lower electrode 44 is formed on the membrane layer to include a region of the air gap in the membrane supporting layer 46b. As a result, the piezoelectric layer 42 of the FBAR is suspended over the air gap, thus being allowed to freely vibrate. The membrane supporting layer 46a and the membrane layer 46b may include insulating material such as $SiO_2$.

The piezoelectric layer 42 is formed by depositing a piezoelectric material such as ZnO or AlN by a sputtering process. In the present invention, all the sides of the piezoelectric layer can form curved lines.

The pair of electrodes 43 and 44 formed on both surfaces of the piezoelectric layer 42, respectively, are constructed to be partially opposite and overlapped. The present invention is characterized in that all the sides of the electrodes 43 and 44 are curved.

In the FBAR 40 having such a construction, a lateral mode 45 generated on one of the side so as shown in FIG. 5b, is destroyed by interference with another lateral mode during its propagation while part of electric energy inputted to the piezoelectric layer 42 through the electrodes 43 and 44 is converted into mechanical energy and the mechanical energy is reconverted into electric energy. Accordingly, only a signal around a resonant frequency, which is adjusted by the thickness of the piezoelectric layer 42, can pass therethrough.

Additionally, in order to effectively destroy any lateral mode generated on or reflected by any side using interference, the curved line of each side preferably has not a fixed curvature but curvatures continuously varying depending upon the position of the line.

Figure 6:
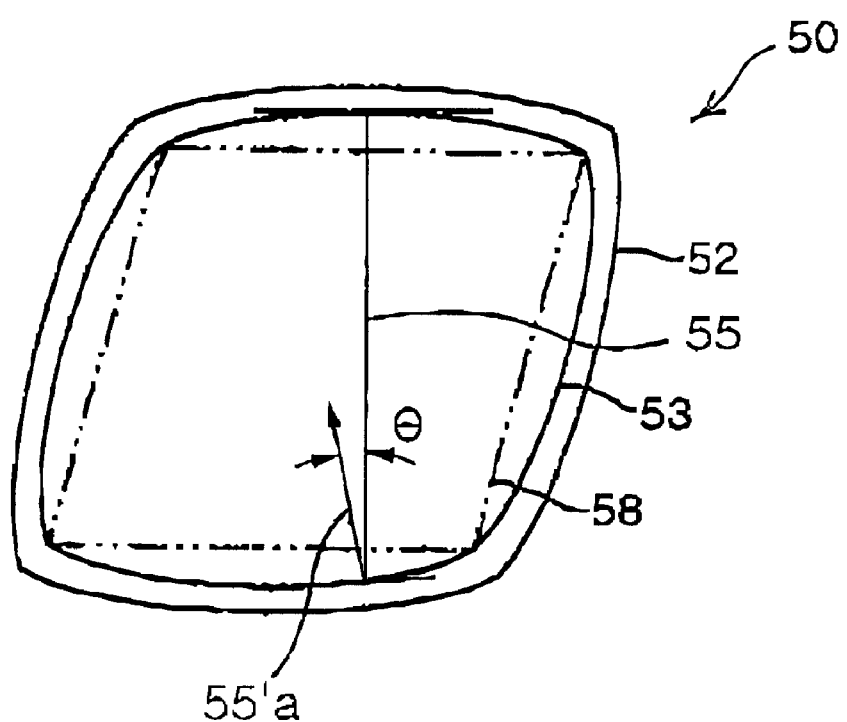
FIG. 6 is a view of another electrode of the FBAR of the present invention.

FIG. 6 is a view of another electrode of the FBAR in accordance with the present invention. Hereinafter, for ease of illustration, a plan view showing part of an upper electrode and a piezoelectric layer is presented so as to describe FBARs of the present inventions. An FBAR 50 shown in FIG. 6 is an improvement of the FBAR 40 shown in FIGS. 5a and 5b. In the FBAR 40 shown in FIGS. 5a and 5b, when the normal line of the lateral mode 45a generated on one of the curved sides of the piezoelectric layer 42 or the electrode 43 is parallel with the normal line of the opposite side, lateral modes generated on both sides can be superposed on one another. In the FBAR 50 shown in FIG. 6, the piezoelectric layer or electrode varies in its shape so that all the sides of the piezoelectric layer 52 or upper electrode 53 are allowed to form curved lines and the shape of an imaginary reference polygon 58 indicated by two-dot chain lines is allowed to be a parallelogram. In this embodiment, it is preferable that all the sides of the, upper and lower electrodes or piezoelectric layer are curved, and an angle θ formed by a normal line (that is, a lateral mode 55) extending from any position of a curved side and a normal line 55'a extending from the opposite curved side to which the former normal line extends is prevented from being 0°. The angle is greater than 0° and smaller than 180°. However, in this case, normal lines can coincide with each other at some positions according to the interior angle of an imaginary parallelogram. Accordingly, there is still a possibility that lateral modes do not interfere with one another at some positions according to the degree of the coincidence.

Figure 7:
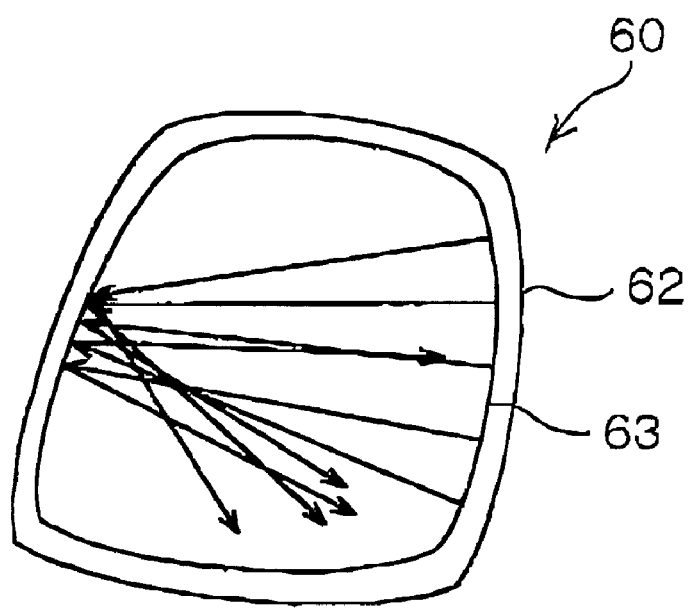
FIG. 7 is a view of still another electrode of the FBAR of the present invention.

An improvement of the FBAR shown in FIG. 6 is a FBAR shown in FIG. 7. In the structure of the FBAR of FIG. 6, the shape of the resonator is line symmetrical with regard to the diagonals of an imaginary parallelogram, so lateral modes can cause reflection superposition along part of the curves. The FBAR 60 of FIG. 7 is different from the FBAR 50 of FIG. 6 in that the sides of the internal imaginary polygon of the FBAR 60 are not parallel to one another so all the sides of a piezoelectric layer 62 and electrodes 63 are curved. In the FBAR 60 of the present invention, all the sides of the piezoelectric layer 62 and the electrodes 63 are curved. The internal imaginary polygon 68 constituted by the curved sides preferably forms an irregular shape. In this embodiment, all the sides of the upper and lower electrodes or piezoelectric layer are curved, and an angle formed by a normal line (that is, a lateral modes) extending from any position of a curved side and a normal line extending from the opposite curved side to which the former normal line extends is greater than 0° and smaller than 180°.

In other words, the structure shown in FIG. 7 is asymmetrically curved. In more detail, the asymmetric structure is formed in such a way that its two sides are allowed to have different lengths, like the upper and lower sides of the structure of FIG. 7, or are allowed to have the same length but different curvatures, like the right and left sides of the structure of FIG. 7.

Figure 1A:
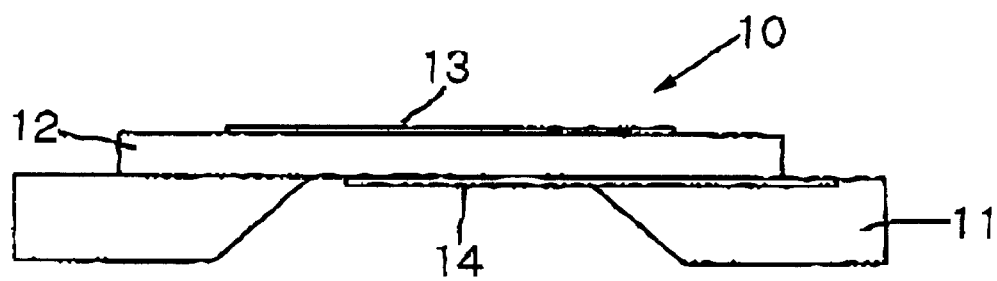
Figure 1B:
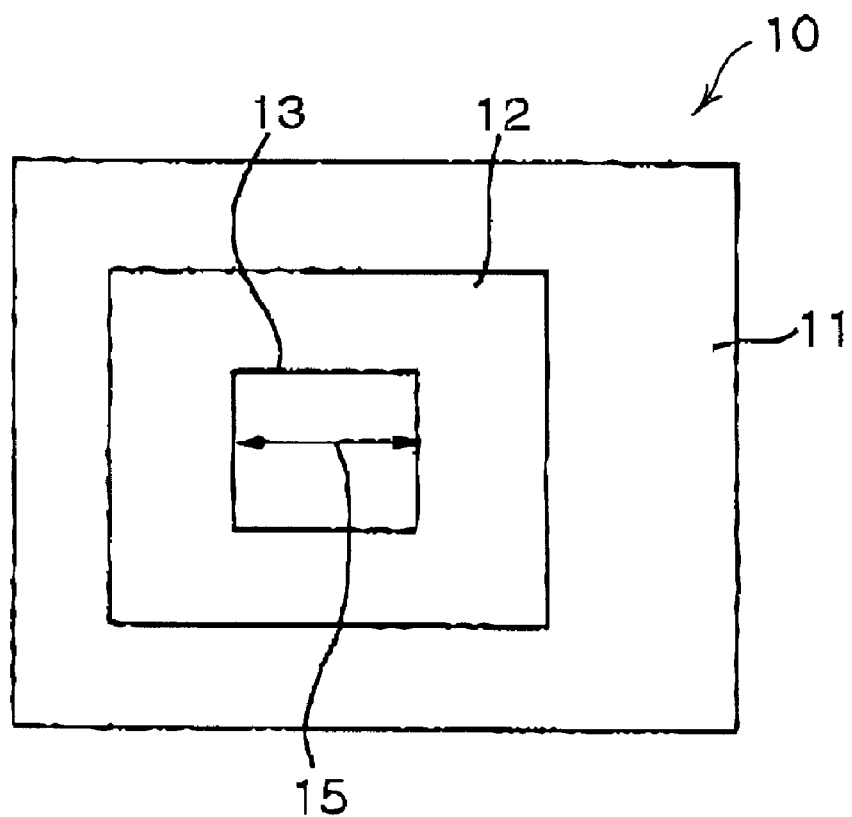
Figure 2:
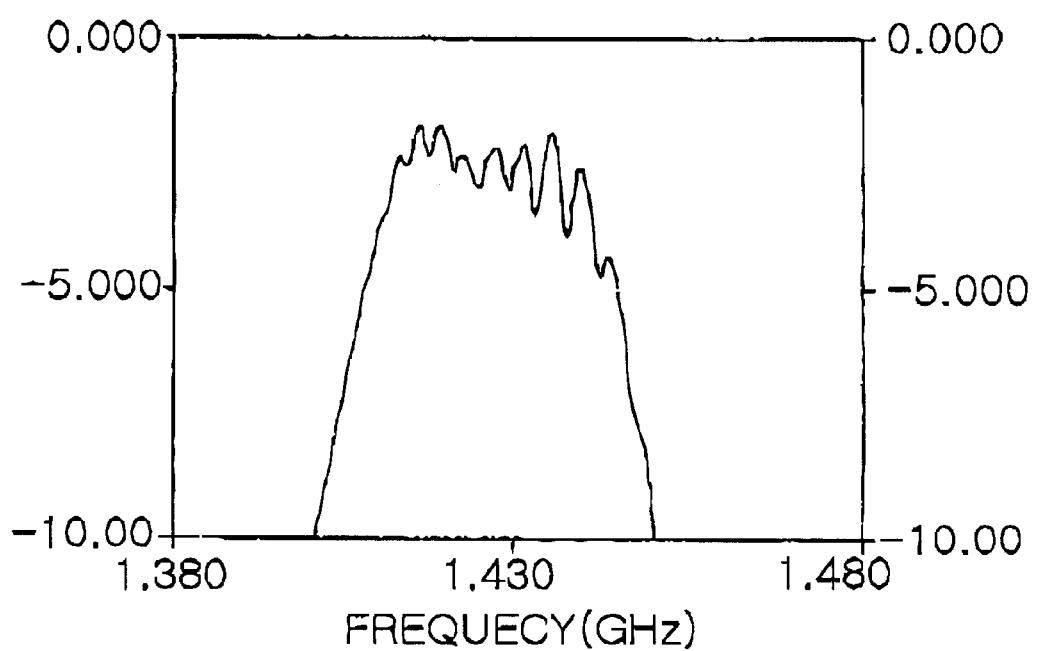
FIG. 2 is a graph, showing the frequency pass characteristics of a conventional FBAR filter constructed by combining the conventional FBARs.

In such an asymmetric curved structure, lateral modes indicated by arrows are reflected at different angles and destroyed. Accordingly, this structure can achieve the effect of interference or destruction greater than that for the asymmetric straight structure shown in FIG. 2 in which lateral modes are reflected at the same angle.

The operational effect of the FBAR of the present invention is described in detail with reference to FIG. 8.

Figure 3:
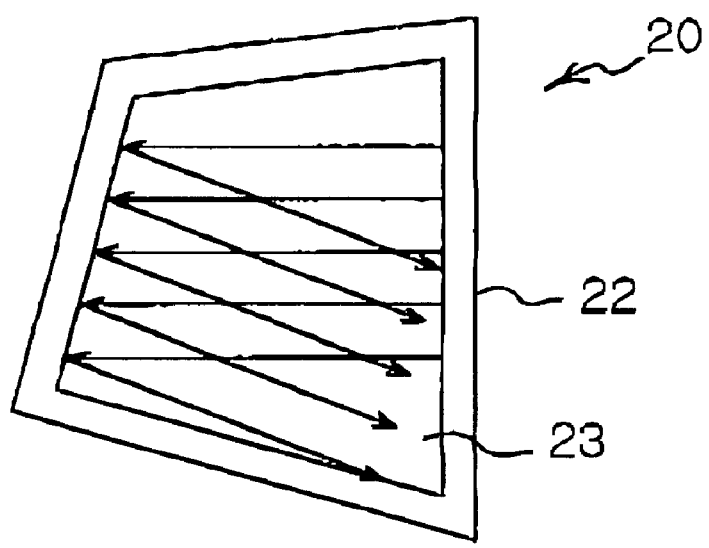
FIG. 3 is a view of an electrode of the conventional FBAR.
Figure 4:
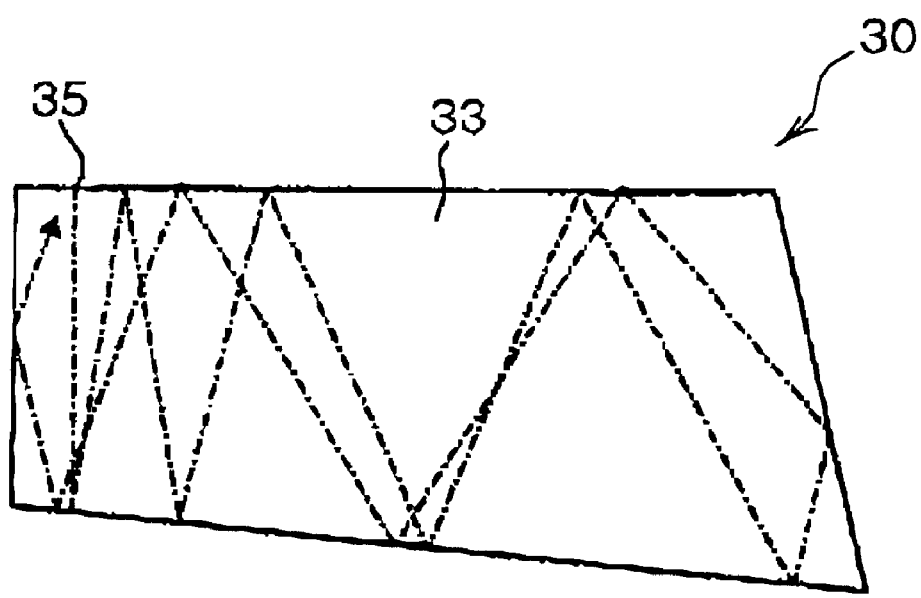
FIG. 4 is a view of another electrode of the conventional FBAR.
Figure 8:
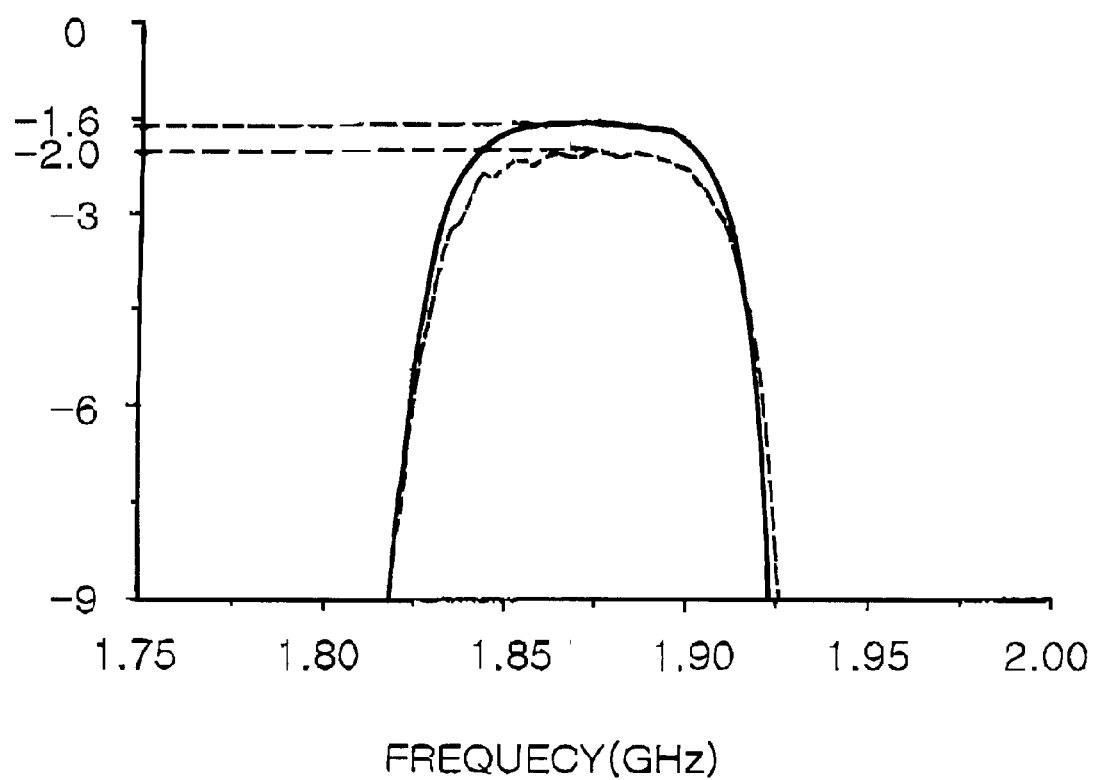
FIG. 8 is a graph showing the frequency pass characteristics of the FBAR filters constructed by combining the FBARs of FIGS. 3 and 7, respectively.

FIG. 8 is a graph showing the frequency pass characteristics of filters constructed by combining the FBARs of FIGS. 3 and 7, respectively. In this frequency pass characteristic graph, a solid line shows frequency pass characteristics of the filter comprised of the FBARs of FIG. 7, while a dotted line shows frequency pass characteristics of the filter comprised of the FBARs of FIG. 3.

In the frequency pass characteristics of the filter comprised of the asymmetric curved resonators of FIG. 7 according to the present invention, no prominences and depressions are found. In contrast, in the frequency pass characteristics of the filter comprised of the conventional asymmetric straight resonators, about five to six prominences and depressions each pair having a difference of about 0.16 t 0.2 dB in height are found.

In particular, the filter comprised of the asymmetric curved resonators of the present invention can reduce about 20% insertion loss in comparison with a conventional filter comprised of conventional asymmetric straight resonators. That is, the conventional filter comprised of the conventional FBARs has an pass band insertion loss of about 2.0 dB, while the filter of the present invention has an pass band insertion loss of about 1.6 dB.

As described above, in the conventional FBAR shown in FIG. 3, lateral modes are reflected at the same angle to reduce an interference effect, so the insertion loss characteristics of the conventional FE are deteriorated. In the asymmetric curved structure of the present invention, all the sides of the sectional shape of the FBAR are curved and constructed to be asymmetric, so lateral modes are reflected at different angles, thereby improving the pass characteristics of the FBAR of the present invention.

Figure 9:
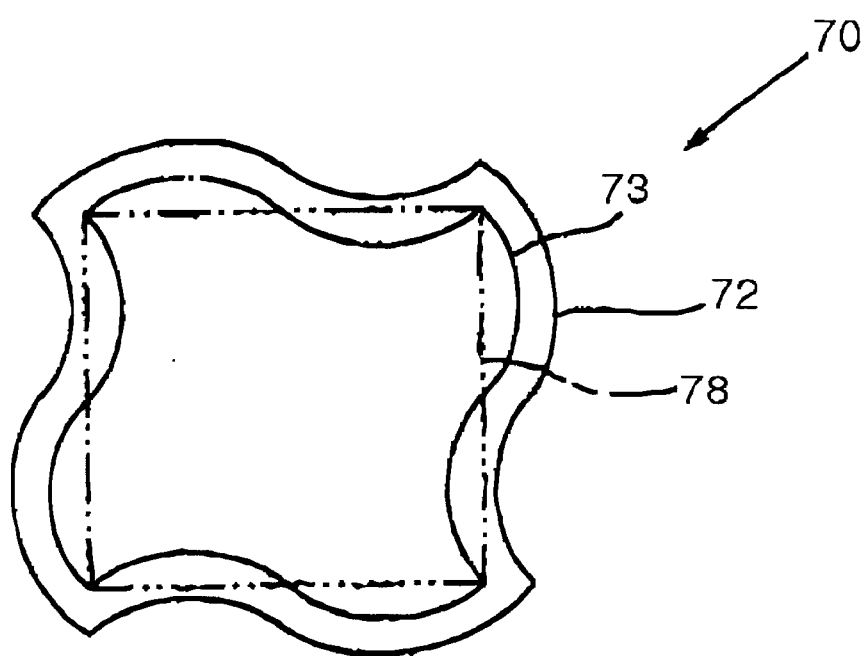
FIG. 9 is a view of still another electrode of the FBAR of the present invention.

Since the FBARs according to the present invention is characterized in that all the sides of a pair of electrodes or the piezoelectric layer are curved lines and the curved lines are convex, the curved sides of the electrodes or the piezoelectric layer are constructed to be various. FIG. 9 illustrates an example of such a FBAR. The FBAR 70 shown in FIG. 9 allows the curved sides of its piezoelectric layer 72 or electrode 73 to have varying curvatures. In the FBAR 70 of FIG. 9, each of the curved sides has a sine wave form that is convex at its one halt and concave at its other half. The FBAR having such a structure varies the reflection angle of a lateral mode generated at a point, and, consequently, can prevent the superposition of the lateral mode. However, it is most preferable that the shape of the piezoelectric layer 82 or electrode 83 is deformed so that a polygon formed within the curved sides of the piezoelectric layer 82 or electrode 83 has an irregular shape. In the FBAR 80, lateral modes are interposed on one another, but neighboring modes are destroyed through interference.

Figure 10:
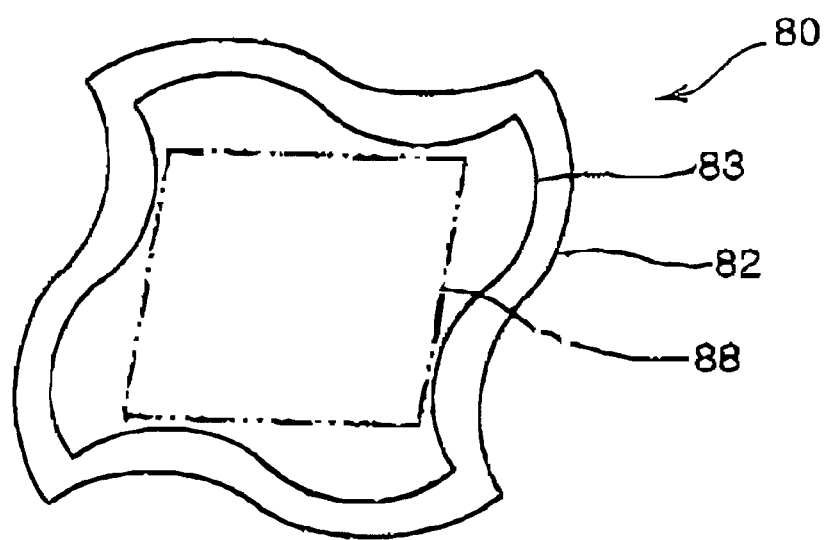
FIG. 10 is a view of still another electrode of the FBAR of the present invention.
Figure 11:
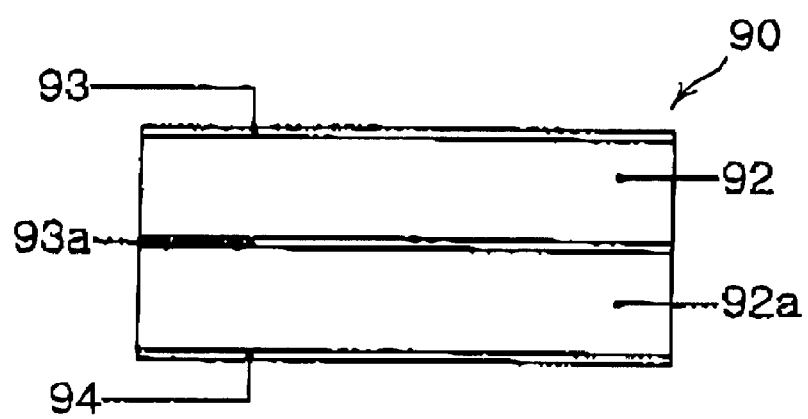
FIG. 11 is a sectional view of a general Stacked Bulk Acoustic Resonator (SBAR).

In the meantime, the FBAR is generally comprised of a single piezoelectric layer. A SBAR is fabricated by bonding two or more piezoelectric layers to one another in their transverse direction to be acoustically interconnected. FIG. 11 illustrates a basic structure of a general SBAR. A SBAR 90 shown in FIG. 11 transmits sound energy to a piezoelectric layer 92a through a signal across electrodes 93 and 93a at a resonant frequency of the piezoelectric layer 92a. The mechanical vibrations of the piezoelectric layer 92 are converted into electrical signals in electrodes 93a and 94. Additionally, a band pass filter, which is capable of passing a certain frequency therethrough, is fabricated by connecting a plurality of resonators in series/parallel with one another using the resonant frequency and anti-resonant frequency of the resonator. Although the present invention is described with the FBARs taken as examples, the inventive concept of the present invention can be applied to SBARs and filters comprised of FBARs and SBARs as well as the FBARs in the same manner. For example, the shape of the piezoelectric layer or electrode of the SBAR can be formed the same as that of FIG. 10 by applying the shape of the piezoelectric layer or electrode to the SBAR.

As described above, the present invention provides the FBAR, which is capable of suppressing lateral modes, thereby allowing smooth characteristics without irregularities.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A film bulk acoustic resonator (FBAR), comprising:

a piezoelectric layer;

a pair of electrodes being formed on opposite surfaces of the piezoelectric layer and partially overlapping each other;

a substrate; and a supporting layer formed on the substrate and provided with a certain internal space;

wherein the piezoelectric layer is formed on the supporting layer; and all sides of at least one of the electrodes and the piezoelectric layer are curved.

2. The FBAR according to claim 1, wherein the supporting layer comprises a membrane supporting layer formed on the substrate and provided with a certain cavity region and a membrane layer formed on the membrane supporting layer, and the piezoelectric layer is formed on the membrane layer to include a region corresponding to the cavity region.

3. A film bulk acoustic resonator, comprising:

a substrate;

a supporting layer formed on the substrate to form an air gap;

at least two piezoelectric layers formed on the supporting layer; and a pair of electrodes formed on both surfaces of the piezoelectric layer to be partially opposite and overlapped;

wherein all sides of at least one of the electrodes and/or all sides of at least one of the piezoelectric layers are curved.

4. A filter, comprising: a plurality of FBARs, the FBARs being set force in claim 3 and connected in parallel or series with one another.

* * * * *